US010815654B2

(12) United States Patent
Morrison et al.

(10) Patent No.: US 10,815,654 B2
(45) Date of Patent: Oct. 27, 2020

(54) SUPPLEMENTAL SUPPORT STRUCTURE FOR HOT AISLE/COLD AISLE FORMING APPARATUS AND METHOD OF PROVIDING SUPPLEMENTAL SUPPORT FOR HOT AISLE/COLD AISLE FORMING APPARATUS

(71) Applicant: TATE ACCESS FLOORS, INC., Jessup, MD (US)

(72) Inventors: Rachel Elizabeth Morrison, Columbia, MD (US); Daniel Brent Kennedy, Lovettsville, VA (US)

(73) Assignee: TATE ACCESS FLOORS, INC., Jessup, MD (US)

( * ) Notice: Subject to any disclaimer, the term of this patent is extended or adjusted under 35 U.S.C. 154(b) by 51 days.

(21) Appl. No.: 16/364,650

(22) Filed: Mar. 26, 2019

(65) Prior Publication Data
US 2020/0308821 A1 Oct. 1, 2020

(51) Int. Cl.
| | |
|---|---|
| *E04B 1/24* | (2006.01) |
| *E04C 3/04* | (2006.01) |
| *E04B 1/19* | (2006.01) |
| *E04C 3/02* | (2006.01) |
| *H05K 7/20* | (2006.01) |

(52) U.S. Cl.
CPC .............. *E04B 1/2403* (2013.01); *E04B 1/19* (2013.01); *E04C 3/04* (2013.01); *E04C 2003/026* (2013.01); *H05K 7/20745* (2013.01)

(58) Field of Classification Search
CPC . E04B 1/98; E04B 1/2403; E04B 9/12; E04B 9/14; E04B 9/16; E04F 15/024; E04F 15/02447; E04F 15/02452; E04F 15/02458; E04F 15/02494
See application file for complete search history.

(56) References Cited

U.S. PATENT DOCUMENTS

| | | | | |
|---|---|---|---|---|
| 3,397,499 A | * | 8/1968 | Ward | E04B 9/14 52/777 |
| 3,503,166 A | * | 3/1970 | Lipper | E04B 9/008 52/126.6 |
| 4,630,417 A | * | 12/1986 | Collier | F24F 7/10 52/263 |
| 4,676,036 A | * | 6/1987 | Bessert | E04F 15/02435 52/126.6 |
| 4,685,258 A | * | 8/1987 | Av-Zuk | E04F 15/02452 52/126.6 |

(Continued)

FOREIGN PATENT DOCUMENTS

WO  WO-2019164177 A1 * 8/2019 ........ E04F 15/02458

*Primary Examiner* — Christine T Cajilig
(74) *Attorney, Agent, or Firm* — Oliff PLC (57) ABSTRACT

Supplemental support structure for a hot aisle/cold aisle forming apparatus having vertical supports and a grid of parallel and perpendicular rows of elongated grid members attached to and supported by the vertical supports is disclosed. The supplemental support structure may include vertical support caps attached to the hot aisle/cold aisle forming apparatus above the vertical supports and the grid of parallel and perpendicular rows of elongated grid members and a grid of elongated cross supports. Each of the elongated cross supports may be connected to and supported by at least two of the vertical support caps at an angle of other than 0°, 90°, 180°, and 270° with the parallel and perpendicular rows of elongated grid members.

14 Claims, 9 Drawing Sheets

(56) References Cited

U.S. PATENT DOCUMENTS

| | | | | |
|---|---|---|---|---|
| 5,477,649 | A * | 12/1995 | Bessert | H02G 3/285 |
| | | | | 174/486 |
| 6,581,339 | B2 * | 6/2003 | Thiede | E04H 3/24 |
| | | | | 407/6 |
| 10,570,626 | B1 * | 2/2020 | Kim | E04F 15/02464 |
| 2002/0078638 | A1 * | 6/2002 | Huang | E04B 5/43 |
| | | | | 52/126.6 |
| 2014/0123576 | A1 * | 5/2014 | Meyer | E04F 15/02452 |
| | | | | 52/126.6 |

* cited by examiner

SUPPLEMENTAL SUPPORT STRUCTURE FOR HOT AISLE/COLD AISLE FORMING APPARATUS AND METHOD OF PROVIDING SUPPLEMENTAL SUPPORT FOR HOT AISLE/COLD AISLE FORMING APPARATUS

FIELD OF INVENTION

This invention relates to apparatus that forms hot aisles and cold aisles on opposite sides of rows of IT or computer cabinets in such facilities as IT or data centers. In particular, this invention relates to supplemental support structure that improves the stability and load bearing capacity of that apparatus without increasing the size and/or strength of the members of the apparatus, and to a method of providing supplemental support for the apparatus.

BACKGROUND OF THE INVENTION

Data centers and other facilities that include spaced rows of IT or computer cabinets are well known. It is common in such facilities to install apparatus that forms hot aisles and cold aisles on opposite sides of the rows of IT or computer cabinets. More specifically, the apparatus forms a cold aisle on one side of each row of IT or computer cabinets and a hot aisle on the other side of each row of IT or computer cabinets.

The cold aisles receive the cooling air from the cooling system of the facility. The apparatus is designed such that the cooling air is directed from the cold aisles into and through the adjacent rows of IT or computer cabinets, and then into the hot aisles. The cooling air is heated as it passes through the rows of IT or computer cabinets, such that heated air is received in the hot aisles. That heated air is then exhausted from the facility.

It is common in the industry for the hot aisle/cold aisle forming apparatus to include a plurality of spaced vertical supports arranged in parallel and perpendicular rows. Elongated grid members are attached on their ends to the vertical supports, such that parallel and perpendicular rows of the elongated grid members are formed. One set of the rows of the elongated grid members is parallel to the hot aisles, the cold aisles and the rows of IT or computer cabinets, and the other set of the rows of the elongated grid members is perpendicular to the hot aisles, the cold aisles and the rows of IT or computer cabinets.

Panels, blinds, etc. can be attached to the grid of elongated grid members to form the hot aisles and cold aisles. In addition, accessories, such as cable trays, sprinkler systems, HVAC conduits, light fixtures, etc., may be attached to or otherwise supported by the grid of elongated grid members.

There is always a need for structure and/or a method to improve the stability and/or the load capacity of hot aisle/cold aisle forming apparatus. While one way to improve the stability and/or the load capacity of such apparatus is to make the members of the apparatus larger, there is a need, economic or otherwise, to improve the stability and load bearing capacity of the apparatus without "over designing" the individual members of the apparatus. Further, it is always desirable to render such apparatus less susceptible to damage during earthquakes or other natural disasters.

This invention addresses those needs, as well as other needs that are readily apparent to those of skill in the art.

SUMMARY OF THE INVENTION

Supplemental support structure for a hot aisle/cold aisle forming apparatus having spaced vertical supports and a grid of parallel and perpendicular rows of elongated grid members attached to and supported by the vertical supports of some embodiments of this invention include vertical support caps attached to the hot aisle/cold aisle forming apparatus above the vertical supports and the grid of parallel and perpendicular rows of elongated members and a grid of elongated cross supports. Each of the elongated cross supports is (1) connected to and supported by at least two of the vertical support cap and (2) at an angle other than 0°, 90°, 180°, and 270° with the parallel and perpendicular rows of elongated grid members.

In certain embodiments of the supplemental support structure of this invention, each of the elongated cross supports has two opposite end portions and each of the end portions is attached to one of the vertical support caps.

In further embodiments of the supplemental support structure of this invention, the end portions of two or more of the elongated cross supports are attached to each of the vertical support caps.

In other embodiments of the supplemental support structure of this invention, each of the vertical support caps is directly above one of the vertical supports.

In yet other embodiments of the supplemental support structure of this invention, the vertical support caps include a base plate and upright flanges that extend upwardly from the base plate. The end portions of two or more of the elongated cross supports are attached to the upright flanges.

In yet other embodiments of the supplemental support structure of this invention, the base plate is attached to two or more of the elongated grid members.

In additional embodiments of the supplemental support structure of this invention, each of the vertical support caps has parallel pairs of the upright flanges extending upwardly from the base plate and an end portion of one of the elongated cross supports is received between and attached to each pair of the pairs of upright flanges.

In certain other embodiments of the supplemental support structure of this invention, the base plate includes an extension extending along each of the elongated grid members to which the base plate is attached. Each extension is attached to one of the elongated grid members.

In other embodiments of the supplemental support structure of this invention, the base plate includes a central portion above one of the vertical supports and spaced arms that extend outwardly from the central portion when viewed from above. The extensions also extend outwardly from the central portion when viewed from above. Each of the arms is between two of the extensions at a 45° with each of the two extensions. Each pair of the parallel pairs of the upright flanges has its flanges on opposite edges of one of the arms.

In yet other embodiments of the supplemental support structure of this invention, the structure includes at least one brace assembly. The brace assembly has first and second ends. The first end is attached to one of the vertical supports and the second end is attached to one of the elongated grid members at a location other than a junction of the one of the vertical supports and the one of the elongated grid members.

This invention also includes a method of providing supplemental support for a hot aisle/cold aisle forming apparatus including a plurality of spaced vertical supports and a grid of parallel and perpendicular rows of elongated grid members attached to and supported by the plurality of vertical supports. The method includes the steps of attaching vertical support caps to the elongated grid members, such that each of the vertical support caps is located above one of the vertical supports, and attaching elongated cross support members to the vertical support caps. The elongated cross support members are diagonally positioned relative to the grid of the parallel perpendicular rows of elongated grid members. Each of the elongated grid cross support members includes two opposite end portions, and each of the two end portions is attached to one of the vertical support caps.

DETAILED DESCRIPTION

As stated, one embodiment of supplemental support structure for a hot aisle/cold aisle forming apparatus of this invention, supplemental support structure 21, is illustrated in the figures.

Supplemental support structure 21 includes a plurality of vertical support caps 23, a grid of elongated cross supports 25, and a plurality of brace assemblies 27. Supplemental support structure 21 is attached to a hot aisle/cold aisle forming apparatus, such as hot aisle/cold aisle forming apparatus 29 illustrated in the figures, as described below.

As background, a conventional hot aisle/cold aisle forming apparatus divides the room or facility housing the apparatus into "hot aisles" and "cold aisles," which alternate with rows of IT or computer cabinets. The "cold aisles" receive the cooling air from the cooling system. The cooling air passes from the "cold aisles" through the adjacent rows of IT or computer cabinets. The cooling air is heated in those IT or computer cabinets. The heated air then passes into the "hot aisles," on the opposite side of the IT or computer cabinets from the "cold aisles," and is exhausted from the "hot aisles."

A conventional hot aisle/cold aisle forming apparatus, such as hot aisle/cold aisle forming apparatus 29 in the figures, includes a plurality of spaced vertical supports, such as vertical supports 31 in the figures, and a plurality of elongated grid members, such as elongated grid members 33 in the figures, attached on their ends to the tops of the vertical supports to form a grid of parallel and perpendicular rows of the elongated grid members. More specifically, in a conventional hot aisle/cold aisle forming apparatus, such as hot aisle/cold aisle forming apparatus 29, the vertical supports, such as vertical supports 31, are placed on the floor of the room or facility housing the hot aisle/cold aisle forming apparatus in parallel and perpendicular rows. The ends of elongated grid members, such as elongated grid members 33, are attached to the tops of the vertical supports to form parallel and perpendicular rows of the elongated grid members. One set of the rows of elongated grid members is parallel to the longitudinal direction of the hot aisles and cold aisles, and the other set of the rows of elongated grid members is parallel to the lateral direction of the hot aisles and cold aisles.

Figure 3:
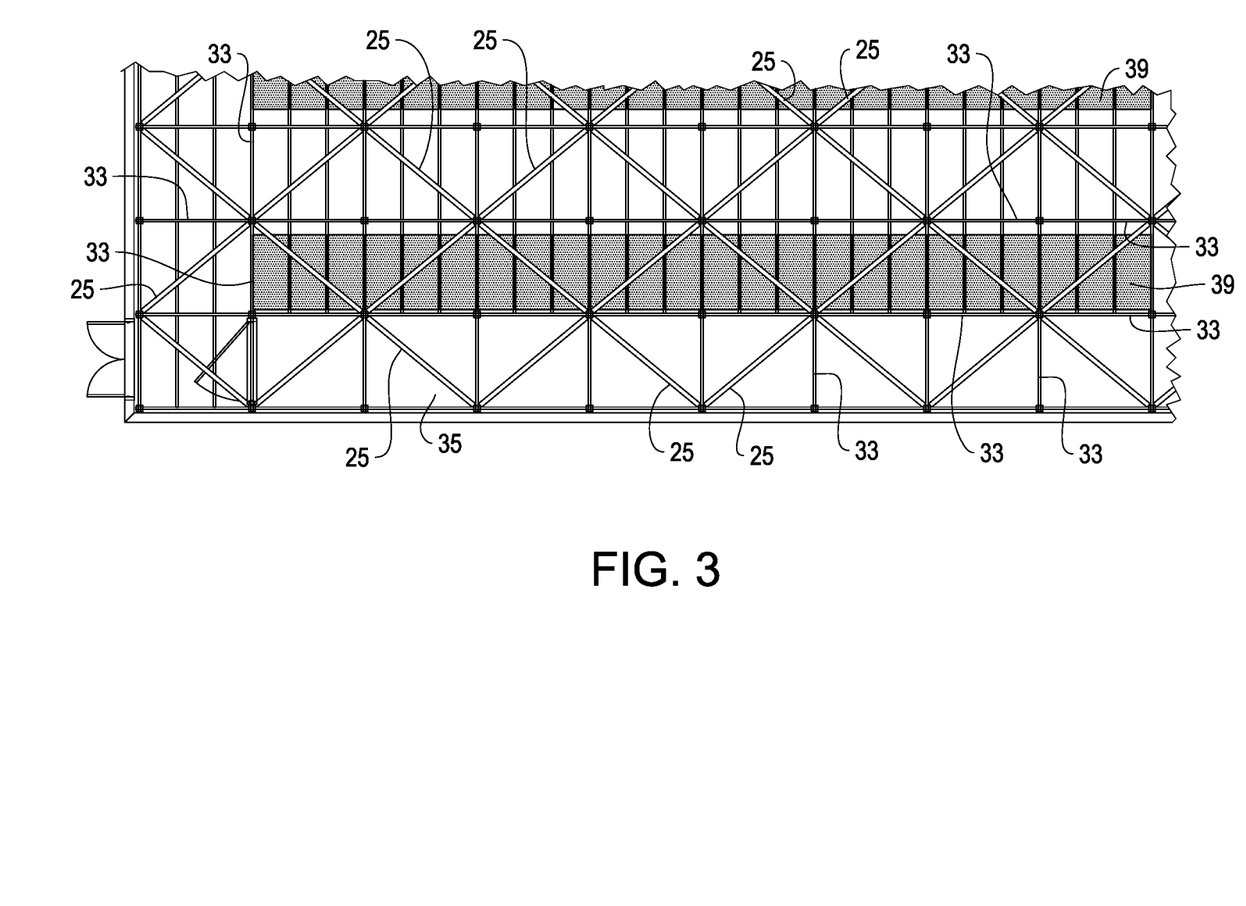
FIG. 3 is a top view of a portion of the embodiment of supplemental support structure for a hot aisle/cold aisle forming apparatus of this invention illustrated in FIGS. 1 and 2, again attached to a hot aisle/cold aisle forming apparatus.
Figure 4:
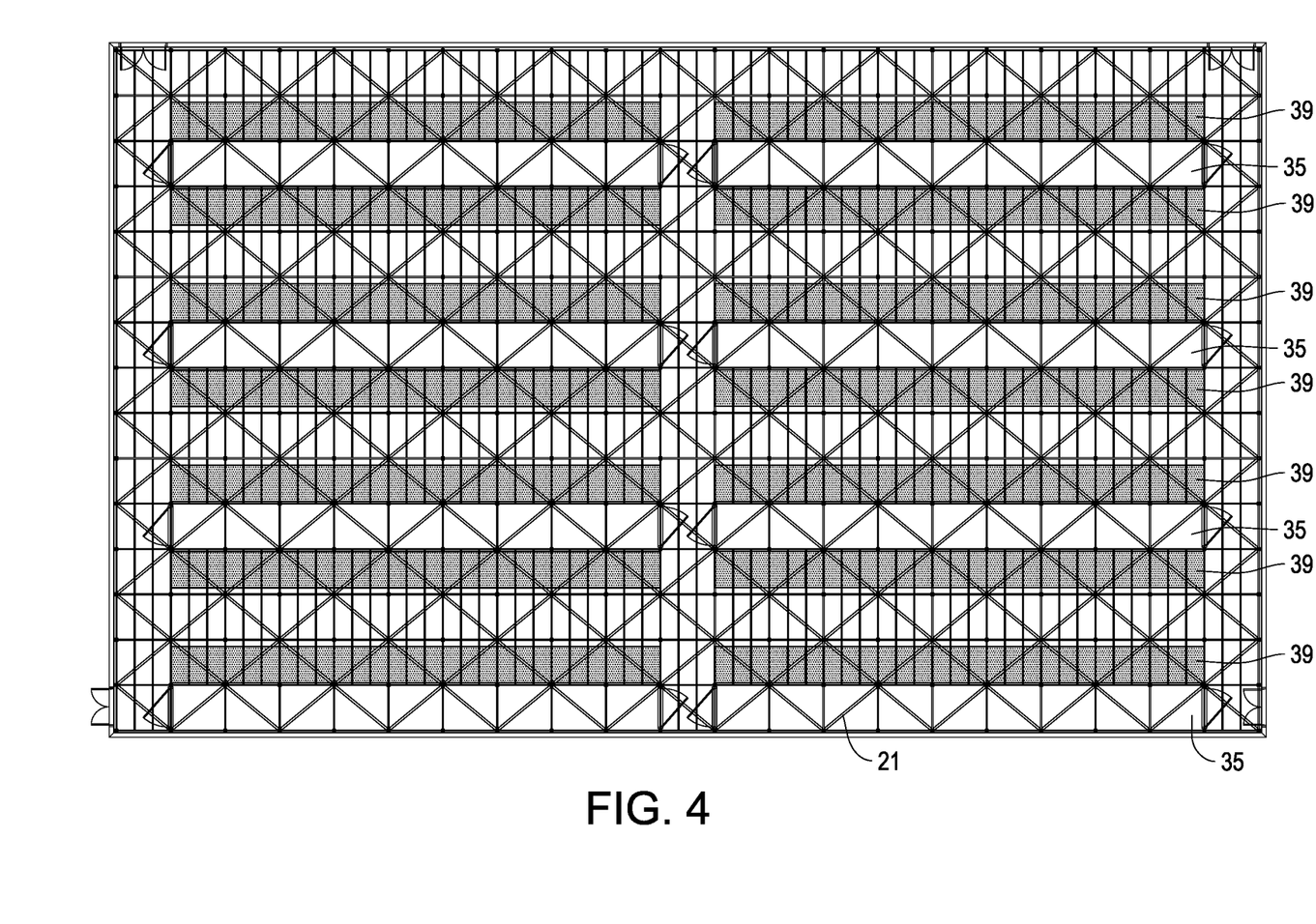
FIG. 4 is a top view of a facility that includes (1) the complete embodiment of supplemental support structure for a hot aisle/cold aisle forming apparatus of this invention illustrated in FIGS. 1-3 and (2) the hot aisle/cold aisle forming apparatus to which the supplemental support structure is attached.

As illustrated in FIGS. 3 and 4, hot aisle/cold aisle forming apparatus 29 defines hot aisles 35 and cold aisles 36 that alternate between rows of IT or computer cabinets 39.

As stated, one embodiment of a vertical support cap that can be utilized in the embodiment of supplemental support structure of this invention illustrated in the figures is vertical support cap 23. Vertical support cap 23 includes base 50 and upright flanges 51-58.

Base 50 includes central area 60 and arms 62-65 and extensions 66-69 that extend outwardly from central area 60. See, e.g., FIGS. 5 and 6.

Arms 62-65 are perpendicular to each other when viewed in plan view. See FIG. 6.

Figure 6:
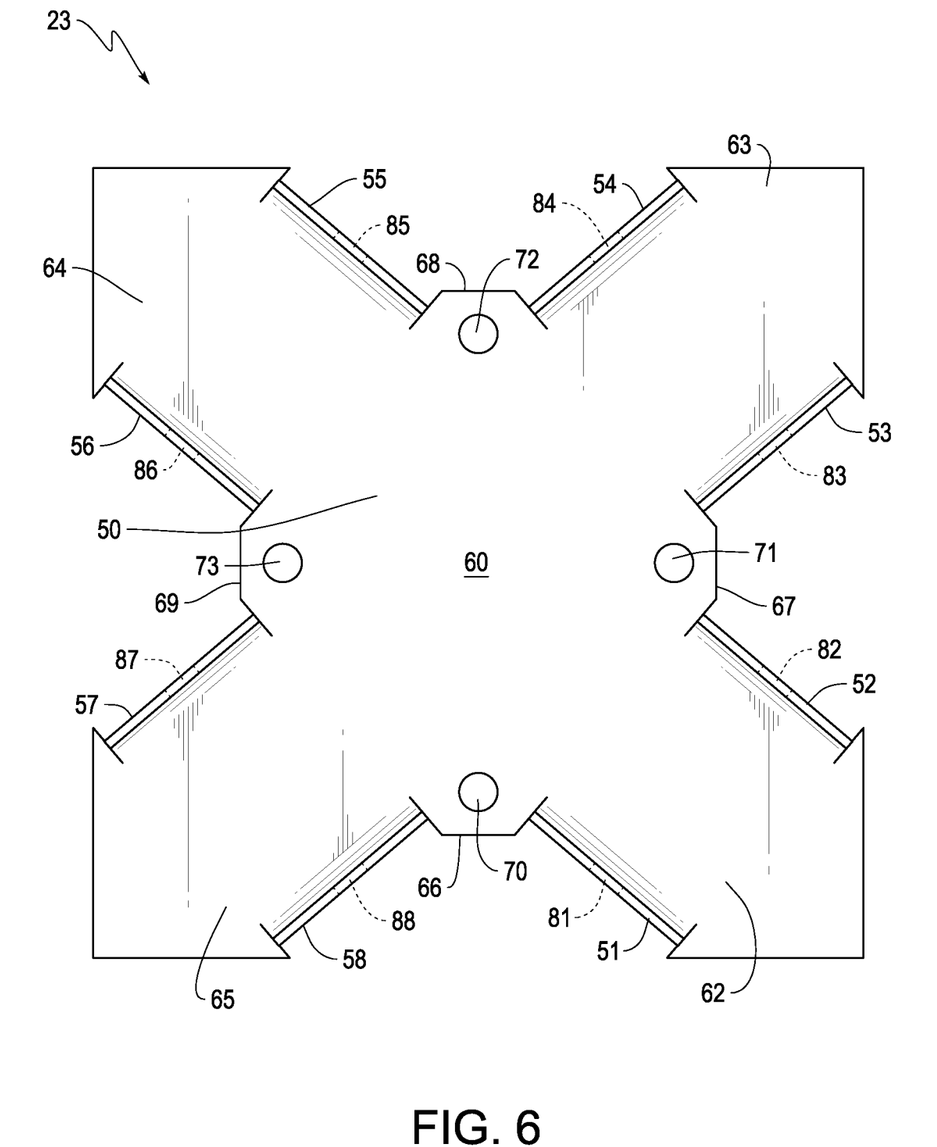
FIG. 6 is a top view of the vertical support cap illustrated in FIG. 5.

Each extension 66-69 is between a pair of adjacent arms 62-65, at approximately a 45° angle with each of the pair of adjacent arms 62-65. More specifically, extension 66 is between and at an angle of approximately 45° with arms 65 and 62, extension 67 is between and at an angle of approximately 45° with arms 62 and 63, extension 68 is between and at an angle of approximately 45° with arms 63 and 64, and extension 69 is between and at an angle of approximately 45° with arms 64 and 65.

Each extension 66-69 has a hole. Specifically, extension 66 has hole 70, extension 67 has hole 71, extension 68 has hole 72 and extension 69 has hole 73. The purpose of holes 70-73 is discussed below.

Figure 5:
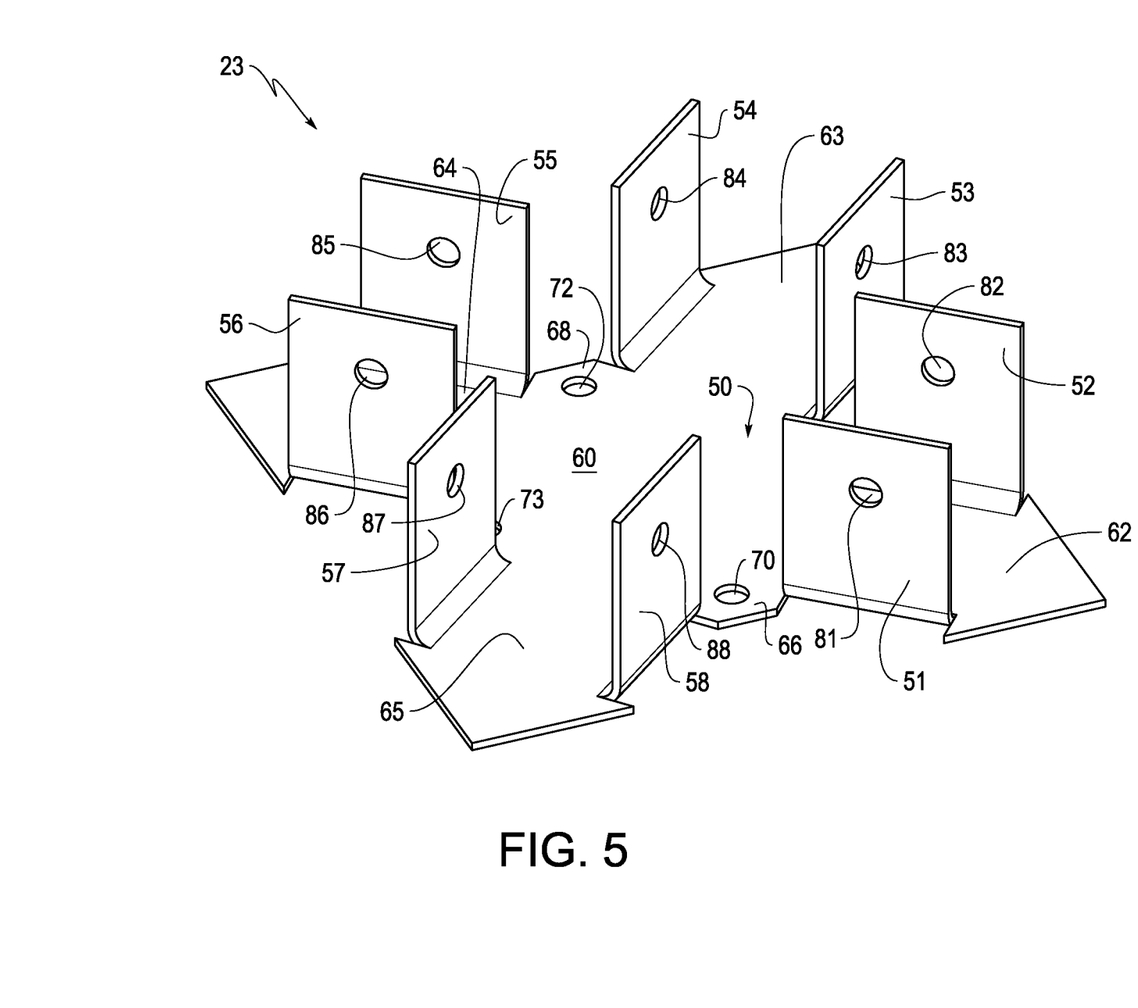
FIG. 5 is a top perspective view of one embodiment of a vertical support cap that can be utilized in the embodiment of supplemental support structure for a hot aisle/cold aisle forming apparatus of this invention illustrated in FIGS. 1-4.

Upright flanges 51-58 form pairs of opposing, spaced and parallel upright flanges, with each pair being located on opposite edges of one of arms 62-66. Specifically, upright flanges 51 and 52 form a pair of opposing, spaced and parallel upright flanges on the opposite edges of arm 62, upright flanges 53 and 54 form a pair of opposing, spaced and parallel upright flanges on the opposite edges of arm 63, upright flanges 55 and 56 form a pair of opposing, spaced and parallel upright flanges on the opposite edges of arm 64, and upright flanges 57 and 58 form a pair of opposing, spaced and parallel upright flanges on the opposite edges of arm 65.

Each pair of upright flanges 51 and 52, 53 and 54, 55 and 56, and 57 and 58 is sufficiently spaced apart such that an end of an elongated cross support, such as elongated cross support 25, can be received between the pair of upright flanges.

Each upright flange 51-58 includes a hole. Specifically, upright flange 51 includes hole 81, upright flange 52 includes hole 82, upright flange 53 includes hole 83, upright flange 54 includes hole 84, upright flange 55 includes hole 85, upright flange 56 includes hole 86, upright flange 57 includes hole 87 and upright flange 58 includes hole 88. The function of holes 81-88 is discussed below.

Figure 7:
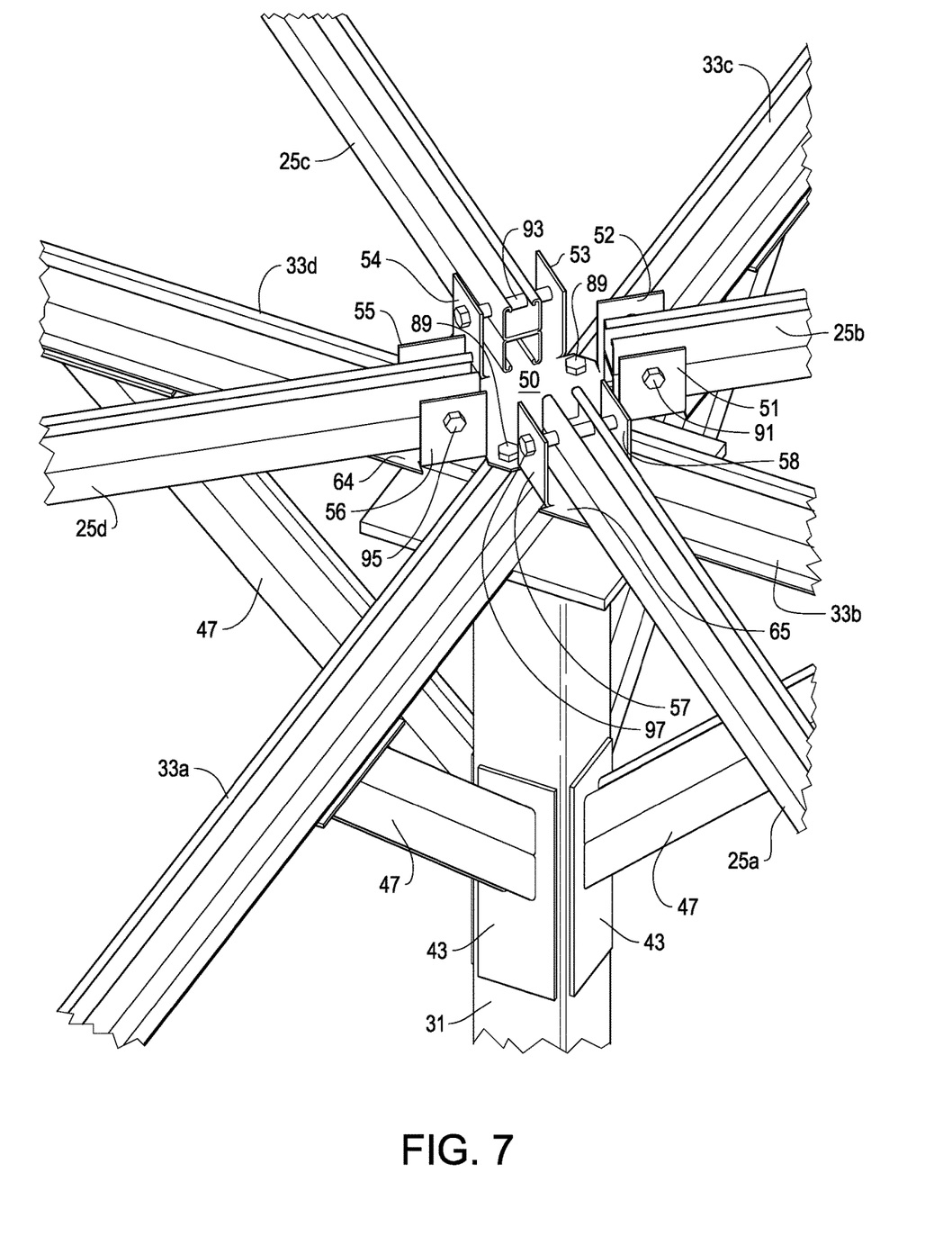
FIG. 7 is a top perspective view of (1) the vertical support cap illustrated in FIGS. 5 and 6, (2) end portions of the four elongated grid members of the hot aisle/cold aisle forming apparatus to which the vertical support cap is attached, (3) end portions of four elongated cross supports of the embodiment of supplemental support structure for a hot aisle/cold aisle forming apparatus of this invention illustrated in FIGS. 1-4 attached to the vertical support cap, and (4) some of the brace assemblies of the embodiment of supplemental support structure for a hot aisle/cold aisle forming apparatus of this invention illustrated in FIGS. 1-4.
Figure 8:
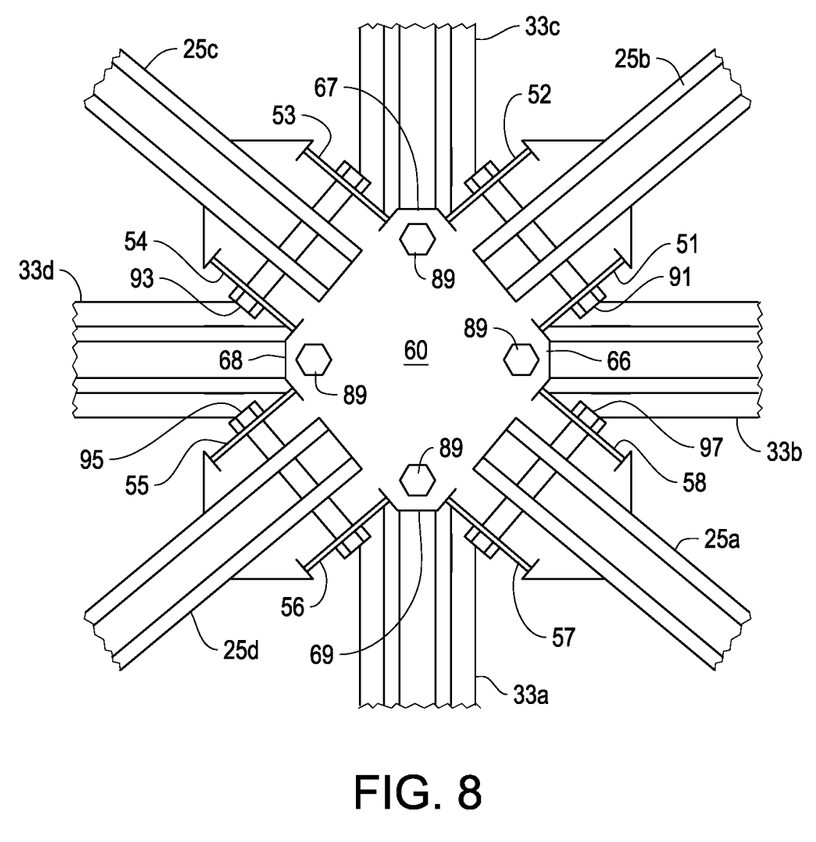
FIG. 8 is a top view of the vertical support cap, the end portions of the four elongated grid members, and the end portions of the four elongated cross supports illustrated in FIG. 7.

FIGS. 7 and 8 illustrate, inter alia, (1) vertical support cap 23 attached to end portions of elongated grid members 33a-d, above vertical support 31, and (2) end portions of elongated cross supports 25a-d attached to vertical support cap 23.

Vertical support cap 23 is attached to end portions of elongated grid members 33a-d, above vertical support 31, by bolts 89 that (1) are received in holes 70-73 of extensions 66-69 and (2) threadedly engage the end portions of elongated grid members 33a-33d. Specifically, one of bolts 89 is inserted through hole 70 in extension 66 and threadedly engages an end portion of elongated grid member 33b, one of bolts 89 is inserted through hole 71 in extension 67 and threadedly engages an end portion of elongated grid member 33c, one of bolts 89 is inserted through hole 72 in extension 68 and threadedly engages an end portion of elongated grid member 33d, and one of bolts 89 is inserted through hole 73 of extension 69 and threadedly engages an end portion of elongated grid member 33a.

An end portion of each of elongated cross supports 25a-d is placed between one of the pairs of upright flanges 51 and 52, 53 and 54, 55 and 56, and 57 and 58, and attached to that pair of upright flanges. Specifically, an end portion of elongated cross support 25a is received between upright flanges 57 and 58 and attached thereto by bolt assembly 97, which passes through hole 87 in upright flange 57, holes in the end portion of elongated cross support 25a and hole 88 in upright flange 57, an end portion of elongated cross support 25b is received between upright flanges 51 and 52 and attached thereto by bolt assembly 91, which passes through hole 81 in upright flange 51, holes in the end portion of elongated cross support 25b and hole 82 in upright flange 52, an end portion of elongated cross support 25c is received between upright flanges 53 and 54 and attached thereto by bolt assembly 93, which passes through hole 83 in upright flange 53, holes in the end portion of elongated cross support 25c and hole 84 in upright flange 54, and an end portion of elongated cross support 25d is received between upright flanges 55 and 56 and attached thereto by bolt assembly 95, which passes through hole 85 in upright flange 55, holes in the end portion of elongated cross support 25d and hole 86 in upright flange 56.

While, in this embodiment of supplemental support structure for a hot aisle/cold aisle forming apparatus of this invention, vertical support cap 23 is attached to end portions of elongated grid members 33a-d by bolts, and end portions of elongated cross supports 25a-d are attached to upright flanges 51-58 of vertical support cap 23 by bolt assemblies, in other embodiments of supplemental support structure for a hot aisle/cold aisle forming apparatus of this invention, the vertical support caps, such as vertical support cap 23, can be attached to end portions of elongated grid members, such as elongated grid members 33a-d, and end portions of elongated cross supports, such as elongated cross supports 25a-d, can be attached to the upright flanges of the vertical support caps, such as upright flanges 51-58, by rivets, welding or, any sufficient method known in the art.

Also, while in this embodiment of supplemental support structure for a hot aisle/cold aisle forming apparatus of this invention, vertical support cap 23 includes a plate-like base with pairs of plate-like upright flanges extending upwardly from the base, the vertical support caps of other embodiments of supplemental support structure for a hot aisle/cold aisle forming apparatus of this invention may include any structure that (1) can be attached to the vertical supports and/or elongated grid members of a hot aisle/cold aisle forming apparatus and (2) can receive and have attached thereto elongated cross supports.

Figure 1:
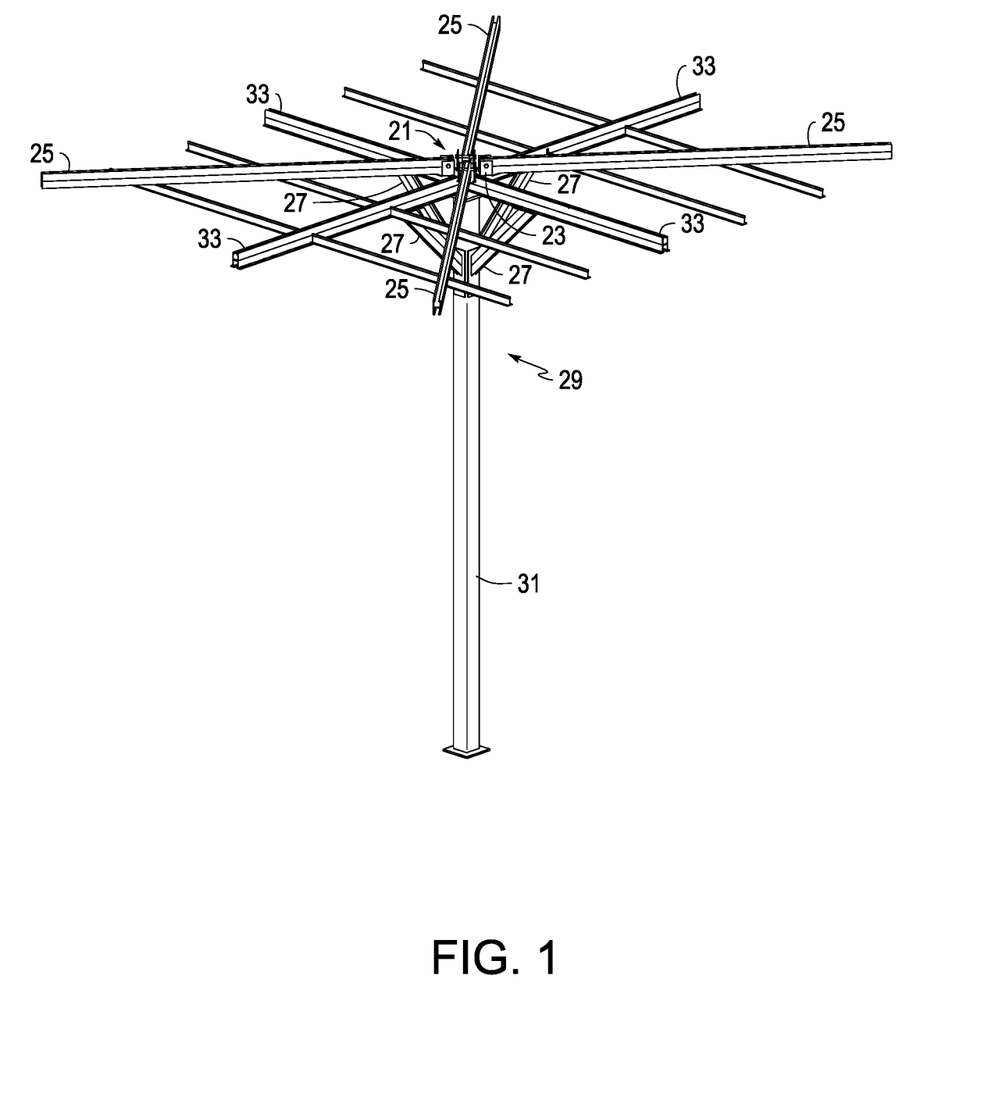
FIG. 1 is a top perspective view of a portion of one embodiment of supplemental support structure for a hot aisle/cold aisle forming apparatus of this invention, attached to a hot aisle/cold aisle forming apparatus.
Figure 2:
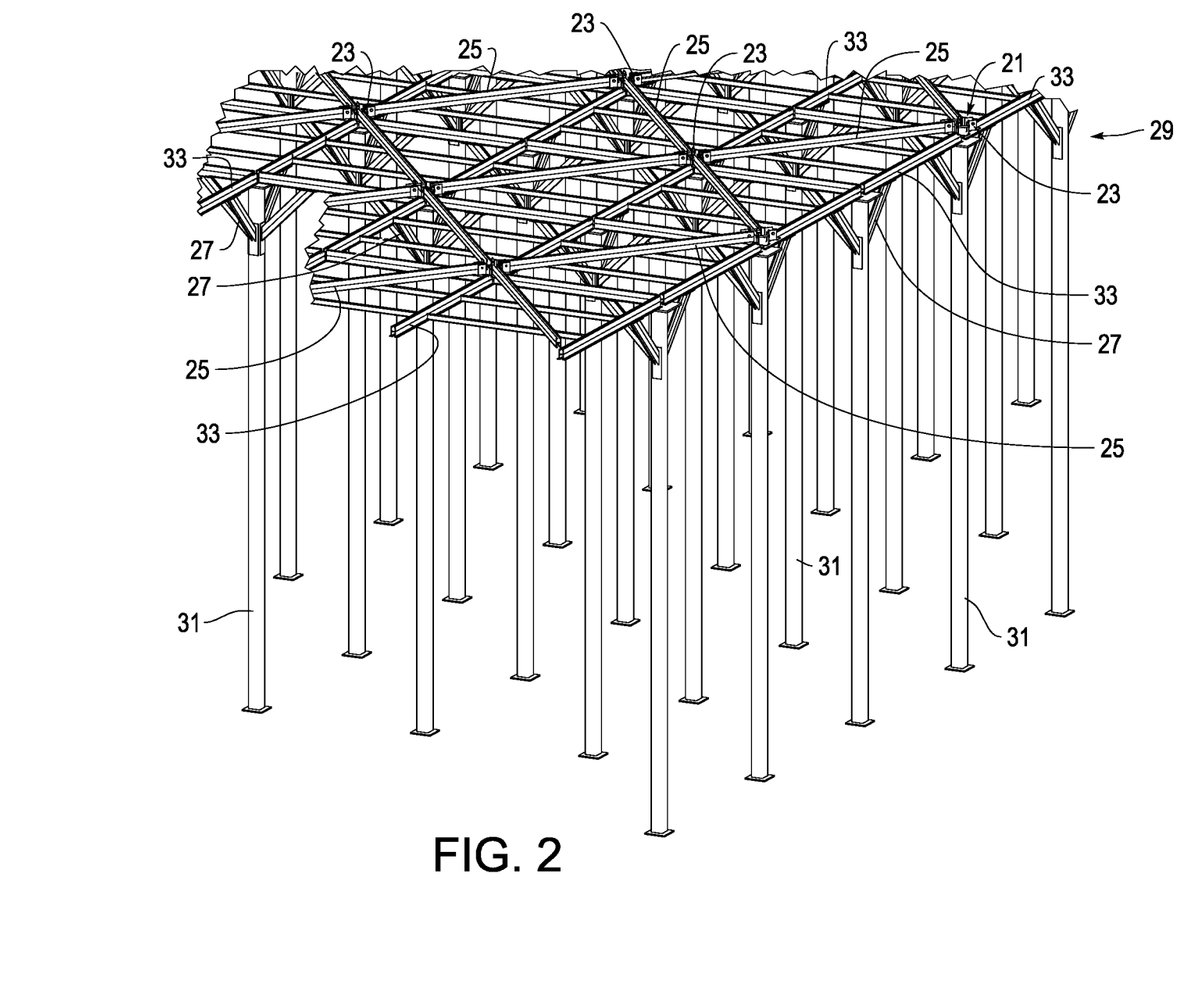
FIG. 2 is a top perspective view of a larger portion of the embodiment of supplemental support structure for a hot aisle/cold aisle forming apparatus illustrated in FIG. 1, again attached to a hot aisle/cold aisle forming apparatus.
Figure 9:
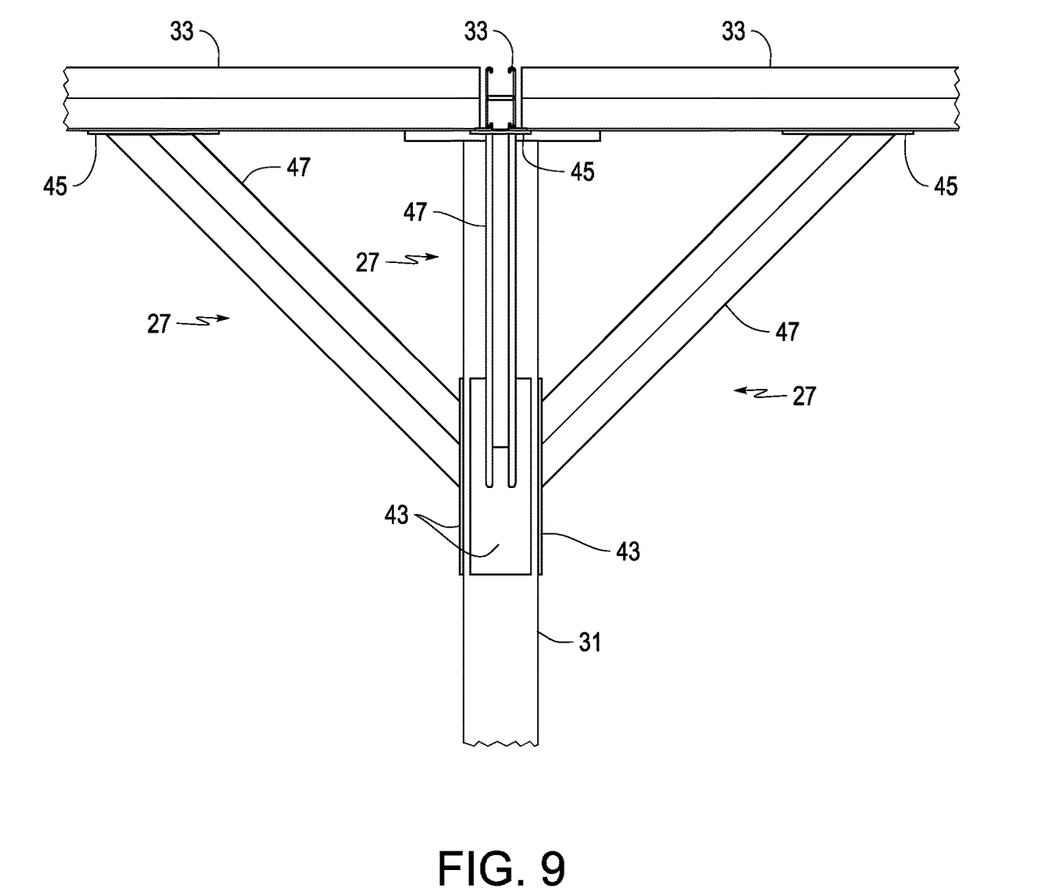
FIG. 9 is a side view of (1) three of the brace assemblies of the embodiment of supplemental support structure for a hot aisle/cold aisle forming apparatus of this invention illustrated in FIGS. 1-4, 7 and 8 and (2) the vertical support and the three elongated grid members of the hot aisle/cold aisle forming apparatus to which the three brace assemblies are attached.

Brace assemblies 27 extend between and are connected on their ends to a vertical support 31 and one of the elongated grid members 33a-d. See, e.g., FIGS. 1, 2 and 9. More specifically, brace assemblies 27 each include base plate 43 attached to a side surface of vertical support 31, base plate 45 attached to the underside of an elongated grid member 33a-d, and brace arm 47 that extends between and is connected at its ends to base plates 43 and 45.

In other embodiments of supplemental support structure for a hot aisle/cold aisle forming apparatus of this invention, the brace assemblies can be any structure/assembly that extends between and provides additional support between the vertical supports and the elongated grid members at a location other than the junctions of the vertical supports and the elongated grid members. Yet other embodiments of supplemental support structure for a hot aisle/cold aisle forming apparatus of this invention may not include the brace assemblies. That is, those embodiments may include only the vertical support caps and a grid of elongated cross-supports attached to the vertical support caps.

What is described and illustrated herein are preferred embodiments of the invention with some variations. The terms, descriptions and figures are intended to be for illustration only, and are not meant as limitations. Those skilled in the art will recognize that many variations are possible within the scope of the invention, as defined by the following claims.

What is claimed is:

1. Supplemental support structure for a hot aisle/cold aisle forming apparatus having spaced vertical supports and a grid of parallel and perpendicular rows of elongated grid members attached to and supported by the vertical supports, comprising:

vertical support caps attached to the hot aisle/cold aisle forming apparatus above the vertical supports and the grid of parallel and perpendicular rows of elongated grid members; and a grid of elongated cross supports, each of the elongated cross supports (1) being connected to and supported by at least two of the vertical support caps and (2) being at an angle other than 0°, 90°, 180° and 270° with the parallel and perpendicular rows of elongated grid members; wherein:

each of the elongated cross supports has two opposite end portions;

each of the two opposite end portions is attached to one of the vertical support caps;

the end portions of two or more of the elongated cross supports are attached to each of the vertical support caps;

the each of the vertical support caps is directly above one of the vertical supports;

the vertical support caps include a base plate and upright flanges that extend upwardly from the base plate; and the end portions of two or more of the elongated cross supports are attached to the upright flanges.

2. The supplemental support structure of claim 1, wherein the base plate is attached to two or more of the elongated grid members.

3. The supplemental support structure of claim 2, wherein the base plate is attached to upper portions of end portions of the two or more of the elongated grid members.

4. The supplemental support structure of claim 2, wherein:

the each of the vertical support caps has parallel pairs of the upright flanges extending upwardly from the base plate; and one of the end portions of one of the elongated cross supports is received between and attached to one of the pairs of the upright flanges.

5. The supplemental support structure of claim 4, wherein:

the base plate includes an extension extending along each of the two or more of the elongated grid members to which the base plate is attached; and the extension is attached to the each of the two or more of the elongated grid members.

6. The supplemental support structure of claim 5, wherein:

the base plate includes a central portion above the one of the vertical supports and spaced arms that extend outwardly from the central portion when viewed from above;

the extensions extend outwardly from the central portion when viewed from above;

each of the spaced arms is between two of the extensions at a 45° angle with each of the two of the extensions; and each pair of the parallel pairs of the upright flanges has the upright flanges along opposing edges of one of the arms.

7. The supplemental support structure of claim 1, further comprising at least one brace assembly, wherein:

the at least one brace assembly has first and second ends; and the first end is attached to one of the vertical supports and the second end is attached to one of the elongated grid members at a location other than a junction of the one of the vertical supports and the one of the elongated grid members.

8. The supplemental support structure of claim 7, wherein each of the at least one brace assembly includes a brace member (1) at an angle of other than 0° and 90° with the one of the vertical supports and the one of the elongated grid members and (2) parallel to the one of the elongated grid members in the plan view.

9. A method of providing supplemental support for a hot aisle/cold aisle forming apparatus including a plurality of spaced vertical supports and a grid of parallel and perpendicular rows of elongated grid members attached to and supported by the plurality of vertical supports, comprising:

attaching vertical support caps that include a base plate and upright flanges that extend upwardly from the base plate to the elongated grid members such that each of the vertical support caps is located above one of the vertical supports and the base plate is attached to two or more of the elongated grid members; and attaching elongated cross support members to the vertical support caps; wherein:

the elongated cross support members are diagonally positioned relative to the grid of the parallel and perpendicular rows of elongated grid members;

each of the elongated cross support members includes two opposite end portions; and each of the two end portions is attached to at least one of the upright flanges.

10. The method of providing supplemental support for a hot aisle/cold aisle apparatus of claim 9, wherein:

the each of the vertical support caps includes parallel pairs of the upright flanges extending upwardly from the base plate;

each of the end portions of the elongated cross support members is positioned between and attached to one pair of the parallel pairs of the upright flanges.

11. The method of providing supplemental support for a hot aisle/cold aisle apparatus of claim 10, wherein:

the base plate includes a central portion, extensions and arms;

the extensions and the arms extend outwardly from the central portion when viewed in the plan view;

the extensions are positioned such that each of the extensions extends along one of the elongated grid members;

the extensions are attached to the elongated grid members; and each pair of the pair of the upright flanges extends upwardly from one of the arms.

12. The method of providing supplemental support for a hot aisle/cold aisle apparatus of claim 11, wherein the each pair of the pairs of the upright flanges includes parallel upright flanges on opposing edges of one of the arms.

13. The method of providing supplemental support for a hot aisle/cold aisle apparatus of claim 12, wherein the vertical support caps are attached to top portions of the elongated grid members above the elongated grid members and the vertical supports.

14. The method of providing supplemental support for a hot aisle/cold aisle apparatus of claim 9, wherein the end portions of two or more of the elongated cross support members are attached to the each of the vertical support caps.

* * * * *